United States Patent [19]

Bräunling et al.

[11] Patent Number: 4,729,851

[45] Date of Patent: Mar. 8, 1988

[54] POLYMERS WITH CONJUGATED DOUBLE BONDS

[75] Inventors: Hermann Bräunling; Reinhard Jira, both Burghausen, Fed. Rep. of Germany

[73] Assignee: Wacker-Chemie GmbH, Munich, Fed. Rep. of Germany

[21] Appl. No.: 898,932

[22] Filed: Aug. 21, 1986

[30] Foreign Application Priority Data

Sep. 4, 1985 [DE] Fed. Rep. of Germany ....... 3531600

[51] Int. Cl.⁴ .......................... H01B 1/00; H01B 1/02
[52] U.S. Cl. .................................... 252/500; 252/512;
252/518; 252/519; 252/520; 524/401; 524/439;
528/230; 528/248; 528/249; 528/251; 528/252;
528/380; 528/396
[58] Field of Search ............... 528/230, 248, 249, 251,
528/252, 380, 396; 252/500, 512, 518, 519, 520;
524/401, 439

[56] References Cited

U.S. PATENT DOCUMENTS 4,503,205  3/1985  Aldissi et al. ...................... 526/221
4,597,896  7/1986  Denisevich et al. ................ 252/500
4,618,454  10/1986  Ballard et al. ...................... 252/500

*Primary Examiner*—Lucille M. Phynes
*Attorney, Agent, or Firm*—Collard, Roe & Galgano

[57] ABSTRACT

Polymers with conjugated double bonds having heterocyclic and/or carbocyclic rings or ring systems in which said rings or ring systems are linked with one another in pairs via a carbon atom as a bridge member. Polymers of the invention have, at least five of said ring or ring-systems. The polymers may be prepared by reacting at least one compound of the formula

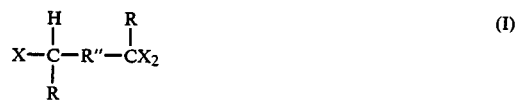

with at least one compound of the formula

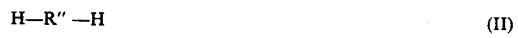

in which X represents fluorine, chlorine, bromine, iodine, hydroxyl, sulfate radicals or radicals of the formula —OR, —SO₃F, —SO₃R or —NR₂;

X₂ represents two radicals X, or an oxygen atom of a carbonyl group;

R represents the same or different alkyl radicals having from 1 to 8 carbon atoms, phenyl and a hydrogen atom; and R″ represents the same or different monocyclic or polycyclic (hetero) arylene radicals optionally substituted by hydrocarbon radicals having 1 to 8 carbon atoms.

19 Claims, 5 Drawing Figures

POLYMERS WITH CONJUGATED DOUBLE BONDS

The present invention relates to polymers with conjugated double bonds with structures having heterocyclic and/or carbocyclic rings or ring systems The rings or ring systems of the invention are combined or connected with each other in pairs via a carbon atom as a bridge member or link. The polymers contain at least five of said rings or ring systems. The polymers, according to the invention, may be prepared by reacting one or a plurality of compounds of the formula

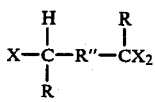  (I)

with one or a plurality of compounds of the formula

H-R''-H  (II)

optionally, under catalysis and/or in a solvent. X, in the above formulas, may independently represent one or more (when a plurality of compounds of Formula I are employed) of the substituents of the group fluorine, chlorine, bromine, iodine, hydroxyl and sulfate radicals or radicals of the formula —OR, —SO$_3$F, —SO$_3$R, —NR$_2$ and, in addition, X$_2$ alone may represent the oxygen atom of a carbonyl group; R represents the same or different alkyl radicals having from 1 to 8 carbon atoms, phenyl radicals or hydrogen atoms with R, preferably being hydrogen atoms; and R'' represents the same or different monocyclic or polycyclic (hetero-)arylene radicals which may be substituted by hydrocarbon radicals having from 1 to 8 carbon atoms.

The polymers according to the invention, following a doping process with suitable substances which are familiar to the worker of ordinary skill in the art, may be used as electrically conductive or semiconductive compounds.

Polymers with structures having heterocyclic or carbocyclic aromatic radicals are known in the art. Polyparaphenylene and its electrical conductivity after doping with arsenic pentafluoride is described, for example by W. L. Shacklette (in *Synthetic Metals I*, 307, 1980). The preparation of copolymers from pyrrole with other heterocyclics by anodic polymerization in the presence of conducting salts is known from European Patent Application No. 99,984 (issued on Aug. 2, 1984, H. Naarmann et al, BASF AG). Apart from the foregoing polyarylenes, doped polyarylene vinylenes are also known, for example such as poly(2,5-thiophendiyl-vinylene) and poly(2,5-furane-diylvinylene), for example, from European Patent Application No. 101,808 (issued on July 3, 1984, G. Kossmehl, Bayer AG).

The difference between the above known substances and the polymers according to the invention is that the (hetero-) arylene radicals of the first-mentioned compounds are linked with each other in pairs either directly or by way of a vinyl group.

An object of the present invention is to provide novel polymers with conjugated double bonds.

It is another object of the present invention to make available novel polymers which are doped with substances which the worker of ordinary skill in the art is familiar with.

It is a more particular object of the invention to provide such novel polymers which, following doping, exhibit electrically conductive or semiconductive properties.

It is yet a further object of the invention to develop a novel process for producing polymers which, upon doping with substances that are known to the skilled artisan, would exhibit electrically conductive or semiconductive properties.

The foregoing and related objects are achieved by reacting one or a plurality of compounds of formula (I) with one or a plurality of compounds of formula (II), if necessary, under catalysis and/or in a solvent. If desired, the volatile reaction products are removing from such compound(s) at temperatures from 20° to 400° C., preferably, from 100° to 300° C, and at pressures of from 10$^{-7}$ to 2000 Pa, which products may be those of the formulas HX or H$_2$X$_2$, and, if present, the solvent and/or catalyst is removed. Said compound may subsequently be mixed with doping agents.

In the above formulas, the R-radicals are, by way of example, hydrogen atoms, alkyl radicals such as the methyl, ethyl, n-propyl, isopropyl, n-butyl, sec-butyl, tert-butyl, n-pentyl and neo-pentyl radicals; the 2-methylbutyl and the 3-methylbutyl radicals; hexyl radicals such as the n-hexyl radical; heptyl radicals, such as, for example, the n-heptyl radical; octyl radicals, e.g., the n-octyl and 2,2,4-trimethylpentyl radicals. Preferably, the R-radicals are hydrogen atoms.

Examples of unsubstituted (hetero-)arylene radicals R'' include o-, m- and p-phenylene radicals; 2,3-, 2,4- and 2,5-thiophendiyl radicals; 2,3-, 2,4- and 2,5-pyrrolediyl radicals; 2,3-, 2,4- and 2,5-furanediyl radicals; 3,4- and 3,5-pyrazolediyl radicals; 2,4- and 2,5-imidazolediyl radicals; 2,4- and 2,5-thiazole-diyl radicals; 3,4- and 3,5-isothiazole-diyl radicals; 2,4- and 2,5-oxazolediyl radicals; 3,4- and 3,5-isoxazolediyl radicals; 2,3-, 2,4-, 2,5-, 3,4-pyridinediyl radicals; as well as diyl radicals of indene, benzofurane, benzo thiophene, quinoline, acridine, pyridazine, pyrimidine, pyrazine, quinoxaline, naphthalene, anthracene, phenanthrene, and phenalene.

Examples of the substituents of the substituted (hetero-)arylene radicals R'' are the alkyl radicals stated above for the R-radicals, furthermore the phenyl, benzyl, o-, m-, p-tolyl radicals and xylyl radicals, cycloalkyl radicals such as the cyclohexyl radical and mono- and dimethylated cyclohexyl radicals, and the cyclopentyl and cycloheptyl radicals.

Alkyl radicals with from 1 to 8 carbon atoms or the phenyl radical and benzyl radical are preferred as substituents of the substituted (hetero-)arylene radicals R''. Among the R'' radicals, arylene or heteroarylene radicals, in particular, phenylene and five-ring heteroarylene radicals substituted, if need be, with C$_1$ to C$_8$ alkyl radicals or phenyl or benzyl radicals are preferred.

Examples of the initial materials of formula (I) which can be used in the process of the invention are radicals having the formulas:

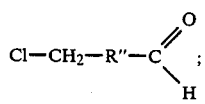

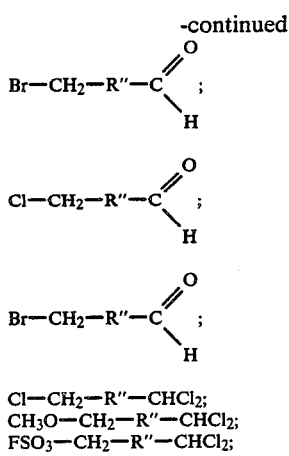

Cl—CH₂—R″—CHCl₂;
CH₃O—CH₂—R″—CHCl₂;
FSO₃—CH₂—R″—CHCl₂;

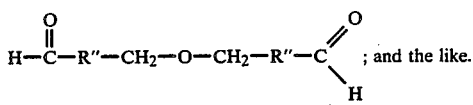; and the like.

Examples of the starting compounds of formula (II) suitable for use in the process of the invention are benzene, toluene, xylenes, thiophene, 2-methylthiophene, 3-methylthiophene, pyrrole, N-methylpyrrole, N-butylpyrrole, 2-methylpyrroles, 3-methylpyrroles, 3,4-dimethylpyrrole, furane, 2-methylfurane, 3-methylfurane, pyrazole, N-methylpyrazole, N-butylpyrazole, imidazole, N-methylimidazole, thiazole, 4-methylthiazole, isothiazole, 4-methylisothiazole, imidazole triazole, pyridazine, pyrazine, oxazole, isoxazole, pyridine, methylpyridines, e.g., α-, β- and γ-picolines and symmetric collidine, indene and alkyl indenes, benzofurane and alkylbenzofuranes, benzothiophene and alkylbenzothiophenes, quinoline, isoquinoline, acridine, pyridazine, alkylpyridazines, arylpyridazines, pyrimidine, alkylpyrimidines, arylpyrimidines, pyrazine, alkylpyrazines, arylpyrazines, quinoxaline, naphthalene, anthracene, phenanthrene, phenalene, diphenyl and others.

The inventive process for producing the polymers of the invention may be carried out in a solvent or solvent mixture; however, the addition of solvent is not necessarily required particularly if the mixture of the reaction components of formulas (I) and (II) initially supplies a clear solution. Examples of suitable solvents are dichloromethane, trichloromethane, tetrachloromethane, 1,2-dichloroethane, trichloroethylene, carbon disulfide and nitrobenzene.

The rate of the chemical reaction, on which the process of the invention is based, is highly dependent on the selection of the reaction partners. While more reactive aromatic compounds such as, for example, pyrrole and alkyl pyrroles can be reacted with 5-chloromethylfurfural within a reasonable period, it is advisable in the reaction of furane with 5-chloromethylfurfural to accelerate the reaction by using a catalyst. Suitable catalysts are Bronstedt-acids such as HCl, H₂SO₄, sulfonic acids such as chlorosulfonic acid; Lewis-acids such as BF₃, BF₃-diethyl etherate, AlCl₃, FeCl₃, SnCl₄, ZnCl₂ or the like. The Lewis-acids are preferably anhydrous acids The amount of catalyst in the reaction mixture depends on the activity of the Bronstedt or Lewis acid selected for the reaction. Generally, amounts of from 0.01 to 10 mole-%, preferably from 0.1 to 5 mole-% of catalyst based on the sum of the molar numbers of the reaction partners of formulas (I) and (II) suffice.

The reaction is carried out at temperatures in the range of 0° and 250° C., preferably in the range of 20° and 200° C.

The reaction may be carried out at elevated pressure or at reduced pressure, i.e., at a pressure of less than 0.10 MPa (absolute pressure). Preferably, the reaction is carried out at the pressure of the ambient atmosphere, thus at or approximately 0.102 MPa (absolute).

If the reaction is carried out by adding a solvent with stirring, the polymers of the invention are obtained in the form of dark, infusible, mostly finely distributed precipitates. Coatings of the polymers of the invention on surfaces, such as, for example, glass, metal or plastic with a smooth, rough or woven finish may be produced by applying the reactants of formulas (I) and (II) to such surfaces optionally, together with a catalyst and/or solvent, and permitting the reactants to react on the surface. If a gaseous catalyst is used, such as, for example, HCl or BF₃, the surface may also be coated with a reaction mixture without the catalyst component. The coated material may be reacted subsequently in an atmosphere containing the catalyst gas.

In general, the reaction components of formulas (I) and (II) are used in a molar ratio of 0.9 to 1.1:1, preferably 0.99 to 1.01:1. However, it may be advantageous if one component, preferably the compound of formula (II), is used in excess, if such component is to simultaneously function as the solvent and, further, if it can be readily removed after the reaction by distilling.

On completion of the reaction, the polymers of the invention may be relieved of most of the catalyst, for example, by washing the precipitate with a suitable solvent.

If the catalyst is gaseous at room temperature and 0.1 MPa pressure, it may be removed from the polymer—which has been filtered off from the solvent—at a pressure below 0.1 MPa and/or a temperature above 25° C. Alternatively, it may be desirable to leave the catalyst in the polymer of the invention if doped polymers are to be produced with the catalyst serving as the doping agent or conducting salt.

If the reaction is carried out in a stirred solution, the polymers, on completion of the reaction, may be filtered off and, optionally, the catalyst may be removed from the polymer.

If a solvent is used, such solvent and volatile reaction products may be distilled off from the polymers of the invention or from the surfaces coated with the polymers of the invention at a pressure below 0.1 MPa and/or a temperature above 25° C., preferably, above 80° C.

The polymers with conjugated double bonds, according to the invention, have at least five, preferably at least ten, hetero- and/or carbocyclic rings or ring systems, wherein each of the rings or ring systems are linked with each other in pairs via a carbon atom serving as the bridge link. The polymers of the invention contain units of the formula

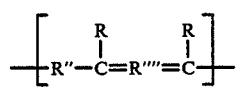 (III)

wherein R and R″ have the meaning stated above and R″″ represents the same or different monocyclic or polycyclic dihydro(hetero)arenediylidene radicals which may be substituted by hydrocarbon radicals having from 1 to 8 carbon atoms. In addition to the units of formula (III), the polymers of the invention may contain units having the formula

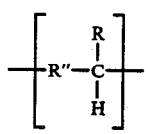  (IV)

wherein R and R" represent the same or different radicals of the type specified above.

Examples of units of formula (III) are:

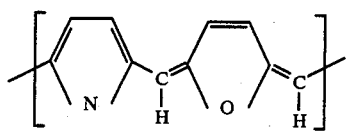  (V)

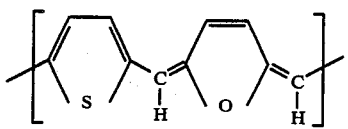  (VI)

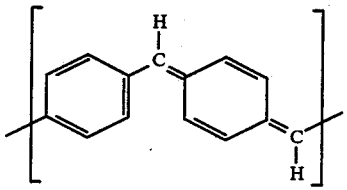  (VII)

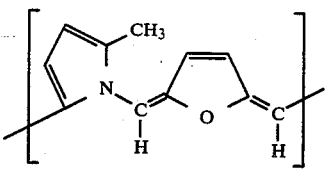  (VIII)

If the rate of reaction is low, intermediate products may be isolated in the process of the invention. For example, in the reaction of 5-chloromethylfurfural with imidazole, the compound of the formula

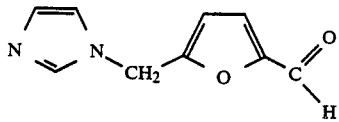  (IX)

was isolated, which on heating to 240° C changes into a black, glassy mass which, after grinding and removal of the volatile components by distilling, supplies a product having a summation formula approximately conforming to formula

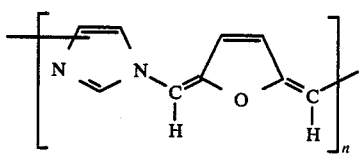  (X)

wherein n is an integer of at least 3.

If a catalyst has been used in the process of the invention and most of the catalyst has not been separated from the polymer on completion of the reaction, the polymers so prepared may already possess considerable electric conductivity. Since the selected catalyst is not always the optimal doping agent for the purpose of the polymer in a given case, the doping agent is normally added in a known manner after the catalyst has been removed. Depending on which doping agent has been selected, the conductivity of the polymers of the invention may be varied greatly within wide limits. Examples of doping agents include alkali metals, such as, e.g., sodium or potassium; proton acids, such as, e.g., $H_2SO_4$, $HClO_4$, $H_2Cr_2O_7$, HI and $HNO_3$; Lewis-acids, such as, e.g., $SbCl_5$, $AsCl_5$, $TiCl_4$, $FeCl_3$, $SnCl_4$, $ZnCl_2$, $AsF_5$ and halogen, such as, for example, iodine. The treatment of the polymers of the invention with doping agent(s) is generally carried out so that the vapors or solutions of the doping agent are permitted to act on the polymer. In most cases, the treatment is carried out at about 10° to 30° C., in most cases with exclusion of moisture and often with exclusion of air. Preferably, the doped polymers contain from 0 to 50%, particularly preferably, from 0.01 to 30% and, in particular, from 0.1 to 20%, by weight, doping agent.

In the following examples, the percentages are based on weight unless stated otherwise. The theoretical analytical values and theoretical yields are based in each case on the corresponding compounds of formula (III). The analytical values stated for nitrogen show that the polymers prepared according to examples 8 to 19 also contain nitrobenzene, for which reason, yields exceeding 100% of the theory have been calculated for some examples.

The invention will now be more fully described by the following examples. It should, however, be noted that such examples are given by way of illustration only and not of limitation.

EXAMPLE 1

Condensation of pyrrole with 5-chloromethylfurfural 2.32 g (34.6 mmoles) pyrrole and 5 g (34.6 mmoles) 5-chloromethylfurfural were each dissolved in 50 ml chloroform at room temperature. The two solutions were combined, whereupon the resulting solution changed its color after a short time first to green and then to brown. Finally, a black precipitate was obtained with noticeable heating of the mixture. The reaction mixture was stored overnight at room temperature and subsequently filtered. A black powder was obtained and washed with chloroform and dried at room temperature and 1.3 Pa pressure.

Yield: 7.35 grams.

Analysis: C =58.5%; H =4.33%; N =7.93%; Cl =17.3%.

Subsequently, the product was heated for 4 hours at 1.3 Pa and 250° C.

Analysis: C =74.0%; H =4.4%; N =9.4%; Cl =2.5%.

Calculated for $(C_{10}H_7NO)_n$: C=76.4%; H=4.5%; N=8.9%.

EXAMPLE 2

Condensation of N-methylpyrrole with 5-chloromethylfurfural

Example 1 was repeated with the modifications of using 1.683 g (20.7 mmoles) N-methylpyrrole instead of pyrrole, and only 3 g (20.7 mmoles) 5-chloromethylfurfural instead of 5 g; each was dissolved in 25 ml chloroform.

Yield: 4.14 grams of a black powder.
Analysis prior to heating: C=58.9%; H=5.12%; N=8.06%; Cl=10.7%.
Analysis after heating: C=77.6%; H=5.30%; N=9.30%; Cl=0.5%.
Calculated for $(C_{11}H_9NO)_n$: C=77.2%; H=5.30%; N=5.2%.

EXAMPLE 3

Condensation of 2-methylpyrrole with 5-chloromethylfurfural

Example 1 was repeated with the modifications of using 1.683 g (20.7 mmoles) 2-methylpyrrole instead of pyrrole and 3 g (20.7 mmoles) 5-chloromethylfurfural instead of 5 g.

Yield: 4.9 grams of a black powder.
Analysis prior to heating: C=57.4%; H=5.5%; N=6.3%; Cl=12.2%.
Analysis after heating: C=68.3%; H=5.1%; N=7.7%; Cl=0.5%.
Calculated for $(C_{11}H_9NO)_n$: C=77.2%; H=5.3%; N=8.2%.

EXAMPLE 4

Condensation of N-butylpyrrole with 5-chloromethylfurfural

A solution of 2.556 g (20.7 mmoles) 1-n-butylpyrrole and 3 g (20.7 mmoles) 5-chloromethylfurfural in 100 ml chloroform was provided with additionally 2 to 3 gas bubbles of HCl gas. The mixture was maintained for 18 hours at room temperature and subsequently for 4 hours at 50° C. The mixture was then treated as in Example 1.

Yield: 4.92 grams of a black, spongy solid material.
Analysis prior to heating: C=61.7%; H=7.1%; N=b 6.1%; Cl=13.0%.
Analysis after heating: C=78.3%; H=7.7%; N=8.2%; Cl=1.8%.
Calculated for $(C_{14}H_{15}NO)_n$: C=78.8%; H=7.1%; N=6.6%.

EXAMPLE 5

Condensation of furane with 5-chloromethylfurfural

A solution of 3.35 g (34.6 mmoles) furane and 5 g (34.6 mmoles) 5-chloromethylfurfural in 50 ml chloroform received an addition of 0.1 ml $BF_3$-diethyl etherate. This solution was then stored for 4 hours at room temperature and subsequently maintained for 12 hours at 50° C. and then treated as in Example 1.

Yield: 4.06 grams of a black powder.
Analysis prior to heating: C=65.0%; H=3.92%; Cl=5.4%.
Analysis after heating: C=76.2%; H=4.4%; Cl=0.5%.
Calculated for $(C_{10}H_6O_2)_n$: C=75.9%; H=3.8%.

EXAMPLE 6

Condensation of thiophene with 5-chloromethylfurfural

Example 5 was repeated with the modification that 3.64 (34.6 mmoles) thiophene was used instead of furane, and only 20 ml chloroform instead of 50 ml, and the mixture was boiled for 8 hours under reflux.

Yield: 3.36 grams of a black powder.
Analysis after heating: C=65.0%; H=3.3%; S=15.6%.
Calculated for $(C_{10}H_6SO)_n$: C=68.9%; H=3.5%; S=18.4%.

EXAMPLE 7

Casting of foil material 202 mg (2.5 moles) N-methylpyrrole was added to a solution of 360 mg (2.5 mmoles) 5-chloromethylfurfural in 5 ml diethyl ether at 0° C. The solution so prepared was cast on a glass surface sized 7.4 by 10.4 cm. The glass surface was limited by glass strips of 1 mm thickness. After storing this casting for 0.5 hours at room temperature, the solvent had largely evaporated and a black, shiny film had precipitated on the surface of the glass.

EXAMPLE 8

Reaction of benzene with α, α, α'-trichloro-p-xylene

A solution of 20 g (95.5 mmoles) α, α, α'-trichloro-p-xylene and 7.46 g (95.5 mmoles) benzene in 100 ml anhydrous nitrobenzene was added, while stirring, to a solution of 1 g anhydrous $AlCl_3$ in 100 ml anhydrous nitrobenzene, dropwise within 45 minutes at 100° C. After keeping the mixture for 1.5 hours at 192° to 202° C., the evolution of HCl had stopped and the mixture had solidified to a gel-like mass. The residue was crushed, thoroughly stirred and sucked off four times, in each case with 400 ml ethanol in an Ultra-Turrax (trademark) type TP 18/10 (manufacturer: Janke & Kunkel, D-7813 Staufen). The black residue was dried for 2 days in the open air and over KOH in a desiccator at 13 Pa, in each case at room temperature.

Yield: 16.4 grams of a black powder.
After heating according to Example 1:
Yield: 14.8 grams (87% of the theoretical yield) of a black powder.
Analysis after heating: C=89.4%; H=5.13%; N=1.0%; Cl=1.5%. Calculated for $(C_{14}H_{10})_n$: C=94.35%; H=5.65%.

EXAMPLE 9

Reaction of benzene with α, α, α'-trichloro-p-xylene

Example 8 was repeated with the modification that heating was carried out for 24 hours at 120° C. instead of 1.5 h at 192° to 202° C.

Yield after heating: 14.3 grams (84.2% of the theoretical yield) of a black powder.
Analysis after heating: C=90.10%; H=5.80%; Cl=1.1%; N=0.6%.
Calculated for $(C_{14}H_{10})_n$: C=94.35%; H=5.65%.

EXAMPLE 10

Reaction of p-xylene with α, α, α'-trichloro-p-xylene

Example 8 was repeated with the modification that 10.13 g (95.5 mmoles) p-xylene was used instead of benzene.

Yield after heating: 19.29 grams (98% of the theoretical yield) of a dark brown powder.
Analysis after heating: C=88.9%; H=5.13%; N=0.87%; Cl=1.0%.
Calculated for $(C_{16}H_{14})_n$: C=93.2%; H=6.8%.

EXAMPLE 11

Reaction of thiophene with α, α, α'-trichloro-p-xylene

Example 8 was repeated with the modification that 8.02 g (95.5 mmoles) thiophene was used instead of benzene.

Yield after heating: 16.2 grams (86% of the theoretical yield) of a dark brown powder.

Analysis after heating: C=76.1%; H=4.04%; N=3.04%; Cl=1.9%; S=11.3%.

Calculated for $(C_{12}H_8S)_n$: C=78.2%; H=4.38%; S=17.4%.

EXAMPLE 12

Reaction of o-xylene with α, α, "-trichloro-p-xylene

Example 8 was repeated with the modification that 10.13 g (95.5 mmoles) o-xylene was used instead of benzene.

Yield after heating: 19.08 grams (96.9% of the theoretical yield) of a dark brown powder.

Analysis after heating: C=90.6%; H=7.0%; N=1.8%; Cl=<0.1%.

Calculated for $(C_{16}H_{14})_n$: C=93.2%; H=6.8%.

EXAMPLE 13

Reaction of m-xylene with α, α, α'-trichloro-p-xylene

Example 12 was repeated with the modification that instead of using o-xylene, an equal amount of m-xylene was used.

Yield after heating: 20.79 grams (105.7% of the theoretical yield) of a dark brown powder.

Analysis after heating: C=89.9%; H=7.2%; N=2.2%; Cl=<0.1%.

Calculated for $(C_{16}H_{14})_n$: C=93.2%; H=6.8%.

EXAMPLE 14

Reaction of p-xylene with α, α, α'-trichloro-p-xylene

Example 8 was repeated with the modification that only 5 g (23.9 mmoles) α, α, α'-trichloro-p-xylene was used instead of 20 g; 2.533 g (23.9 mmoles) p-xylene instead of benzene; only 50 ml nitrobenzene instead of 100 ml; and, 250 mg anhydrous $FeCl_3$ was used instead of anhydrous $AlCl_3$.

Yield after heating: 4.81 grams (97.8% of the theoretical yield) of a black powder.

Analysis after heating: C=88.8%; H=6.8%; N=1.23%; Cl=0.1%

Calculated for $(C_{16}H_{14})_n$: C=93.2%; H=6.8%.

EXAMPLE 15

Reaction of p-xylene with α, α, α'-trichloro-p-xylene

Example 14 was repeated with the modification that 250 mg anhydrous $SnCl_4$ was used instead of anhydrous $FeCl_3$.

Yield after heating: 4.98 grams (101.2% of the theoretical yield) of a black powder.

Analysis after heating: C=90.3%; H=7.1%; N=1.58%; Cl=0.2%.

Calculated for $(C_{16}H_{14})_n$: C=93.2%; H=6.8%.

EXAMPLE 16

Reaction of diphenyl with α, α, α'-trichloro-p-xylene

Example 8 was repeated with the modification that instead of using benzene, 14.72 g (95.5 mmoles) diphenyl was used.

Yield after heating: 23.2 grams (95.7% of the theoretical yield) of a grayish-brown powder.

Analysis after heating: C=92.6%; H=5.65%; N=1.33%; Cl=0.1%.

Calculated for $(C_{20}H_{14})_n$: C=94.45%; H=5.55%.

EXAMPLE 17

Reaction of diphenylmethane with α, α, α'-trichloro-p-xylene

Example 8 was repeated with the modification that instead of using benzene, 16.06 g (95.05 mmoles) diphenylmethane was used.

Yield after heating: 22.48 grams (87.8% of the theoretical yield) of a brown powder.

Analysis after heating: C=91.5%; H=6.2%; N=1.0%; Cl=0.1%.

Calculated for $(C_{21}H_{16})_n$: C=94.0%; H=6.0%.

EXAMPLE 18

Reaction of naphthalene with α, α, α'-trichloro-p-xylene

Example 8 was repeated with the modification that instead of using benzene, 12.23 g (95.5 mmoles) naphthalene was used.

Yield after heating: 22.05 grams (101.2% of the theoretical yield) of a grayish-brown powder.

Analysis after heating: C=90.97%; H=5.80%; N=2.33%; Cl=0.1%.

Calculated for $(C_{18}H_{12})_n$: C=94.7%; H=5.30%.

EXAMPLE 19

Reaction of anthracene with α, α, α'-trichloro-p-xylene

A solution of 20 g (95.5 mmoles) α, α, α'-trichloro-p-xylene and 17.01 g (95.5 mmoles) anthracene in 100 ml anhydrous nitrobenzene was added dropwise to a solution of 1 g anhyrous $AlCl_3$ in 100 ml anhydrous nitrobenzene within 45 minutes under stirring at 100° C. After maintaining the mixture for 1.5 hours at 192° to 202° C., the development of HCl had stopped. The black precipitate was filtered off and washed three times with 100 ml nitrobenzene in each case, and three times with 100 ml methanol in each case, and then dried at room temperature and 1.3 Pa pressure over KOH for 12 hours. Subsequently, the product was heated for 4 hours at 1.3 Pas and 250° C.

Yield: 12.86 grams (48.4% of the theoretical yield) of a black powder.

Analysis: C=92.3%; H=5.3%; N=0.9%; Cl=0.1%.

Calculated for $(C_{22}H_{14})_n$: C=94.9%; H=5.1%.

The filtrate was combined with the washing liquor and 2 liters methanol was added, whereupon a flocculent, dark brown precipitate was obtained. The precipitate was filtered off, washed three times with methanol, using 100 ml in each case, and then dried and heated as specified above in the present example.

Yield: 11.8 grams (44.6% of the theoretical yield) of a black powder.

Analysis: C=92.4%; H=5.4%; N=1.7%; Cl<0.1%.

Calculated for $(C_{22}H_{14})_n$: C=94.9%; H=5.1%.

EXAMPLE 20

Condensation of imidazole with 5-chloromethylfurfural (a) Preparation of 5-(1-imidazolyl)-methylfurfural (IX):

A solution of 3 g (20.8 mmoles) 5-chloromethylfurfural and 1.41 g (20.8 mmoles) imidazole in 25 ml chloroform was heated under reflux for 4 hours. Following cooling of the solution, the solution was washed with aqueous bicarbonate solution and water and the solvents were removed at 2000 Pa and 80° C.

Yield: 3.25 grams (89% of the theoretical yield) of a viscous oil of formula (IX):

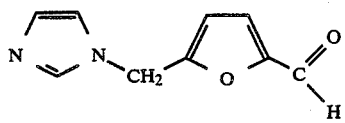

(IX)

$^1$H-NMR (360 MHz): 5.25 ppm s (CH$_2$-group); 6.49 ppm d (J=4.8 Hz); 7.8 ppm s; 7.15 ppm s; 7.26 ppm d (J=4.8 Hz); 7.67 ppm s; 9.63 ppm s.

(b) Polycondensation of imidzaole with 5-chloromethylfurfural:

The test described in (a) was repeated with the modification that prior to heating of the reaction mixture, 0.1 ml BF$_3$-diethyl etherate was added and the mixture was heated under reflux for 8 hours. Following evaporation of the solvent, as described in (a), the viscous residue was heated under argon atmosphere, during which heating the temperature was raised within 4 hours from 100° C. to 240° C. and finally maintained at 240° C. for another 2 hours.

Yield: 4.16 grams of a glassy, shining black, foamy solid material.

Subsequently, the product was finely ground and 3.5 g thereof was heated for 4 hours at 250° C. and 1.3 Pa.

Yield: 1.98 grams (71.6% of the theoretical yield) of a black powder.

Analysis: C=64.5%; H=3.4%; N=11.2%; Cl=2.8%.

Calculated for (C$_9$H$_6$N$_2$O)$_n$: C=68.3%; H=3.8%; N=17.7%.

EXAMPLE 21

Doping of the polymers

The products obtained in the preceding examples and a weighed quantity of iodine were jointly cooled in a Schlenk tube with outside cooling with liquid nitrogen, evacuated to a residual pressure of 1.3 Pa, heated to room temperature and maintained at 120° C. for 24 hours. Table 1 shows the iodine content of the doped polymers as compared to the corresponding non-doped products.

TABLE 1

| Polymer of Example No. | Reactants used in Example* | Iodine content (%) Found | Iodine content (%) Calculated | Conductivity (S/cm) |
|---|---|---|---|---|
| 1 | A, pyrrole | — | 0.00 | $4.6 \times 10^{-9}$ |
| | | — | 7.42 | $2.2 \times 10^{-8}$ |
| | | 8.60 | 13.90 | $9.2 \times 10^{-8}$ |
| | | 10.20 | 24.41 | $4.3 \times 10^{-7}$ |
| | | 32.50 | 39.24 | $7.8 \times 10^{-7}$ |
| | | 52.50 | 56.36 | $9.6 \times 10^{-7}$ |
| | | 64.00 | 72.10 | $9.2 \times 10^{-6}$ |
| 2 | A, N—methyl-pyrrole | — | 0.00 | $5.3 \times 10^{-10}$ |
| | | — | 7.50 | $1.5 \times 10^{-9}$ |
| 5 | A, furane | — | 0.00 | $<1.0 \times 10^{-9}$ |
| | | — | 6.90 | $1.5 \times 10^{-6}$ |
| | | 12.90 | 13.83 | $2.3 \times 10^{-6}$ |
| | | 25.90 | 24.30 | $3.5 \times 10^{-5}$ |
| | | 36.10 | 39.71 | $1.0 \times 10^{-4}$ |
| | | 52.10 | 56.21 | $1.2 \times 10^{-4}$ |
| 8 | B, benzene | — | 0.00 | $<1.0 \times 10^{-11}$ |
| | | 2.0 | 3.44 | $<1.0 \times 10^{-11}$ |
| | | 8.3 | 6.65 | $<1.0 \times 10^{-11}$ |

TABLE 1-continued

| Polymer of Example No. | Reactants used in Example* | Iodine content (%) Found | Iodine content (%) Calculated | Conductivity (S/cm) |
|---|---|---|---|---|
| | | 10.7 | 12.47 | $5.0 \times 10^{-11}$ |
| | | 16.5 | 22.17 | $4.0 \times 10^{-10}$ |
| | | 36.0 | 36.29 | $7.0 \times 10^{-8}$ |
| 10 | B, p-xylene | — | 0.00 | $<1.0 \times 10^{-11}$ |
| | | 3.1 | 2.98 | $<1.0 \times 10^{-11}$ |
| | | 5.9 | 5.80 | $<1.0 \times 10^{-11}$ |
| | | 10.0 | 10.96 | $<1.0 \times 10^{-11}$ |
| | | 21.7 | 19.75 | $9.0 \times 10^{-11}$ |
| | | 31.0 | 32.98 | $6.0 \times 10^{-8}$ |
| 11 | B, thiophene | — | 0.00 | $4.0 \times 10^{-10}$ |
| | | 3.0 | 3.33 | $7.0 \times 10^{-10}$ |
| | | 4.2 | 6.44 | $2.0 \times 10^{-9}$ |
| | | 9.1 | 12.10 | $1.5 \times 10^{-8}$ |
| | | 15.1 | 21.79 | $6.0 \times 10^{-8}$ |
| | | 31.0 | 35.53 | $1.1 \times 10^{-7}$ |

*A = 5-chloromethylfurfural
 B = α, α, α'-trichloro-p-xylene

DESCRIPTION OF THE FIGURES

The figures show the IR-spectra of compressed KBr-blanks of three of the polymers of the invention, as well as $^{13}$C-solid state nuclear spin resonance spectra (75.46 MHz) of two of the polymers of the invention (Apparatus: Bruker MSL-300).

Note

Figure 1:
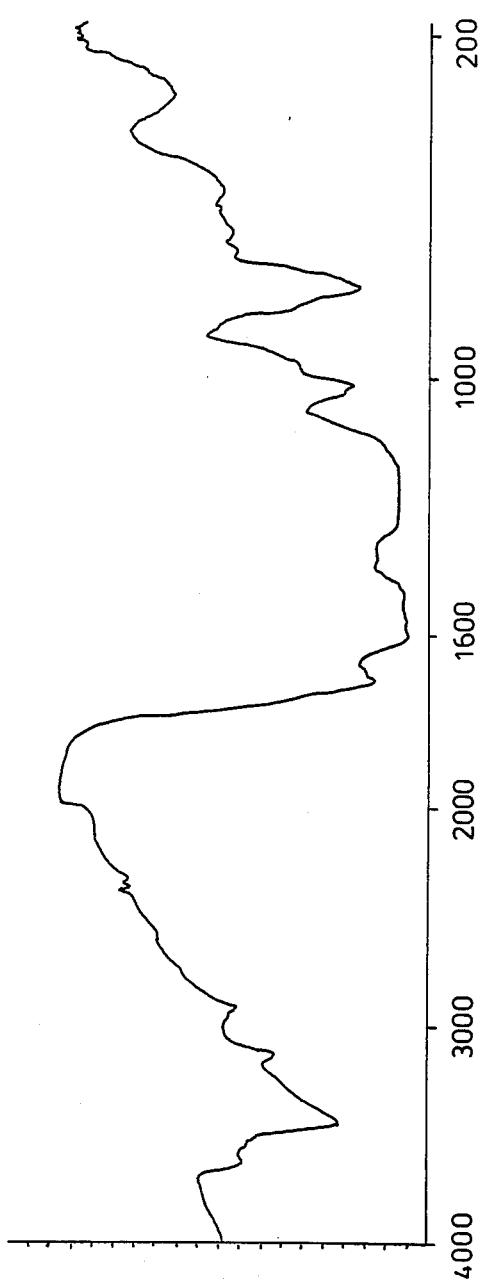
FIG. 1: IR-spectrum of the polymer heated at 250° C. and 1.3 Pa; produced according to Example 1.
Figure 2:
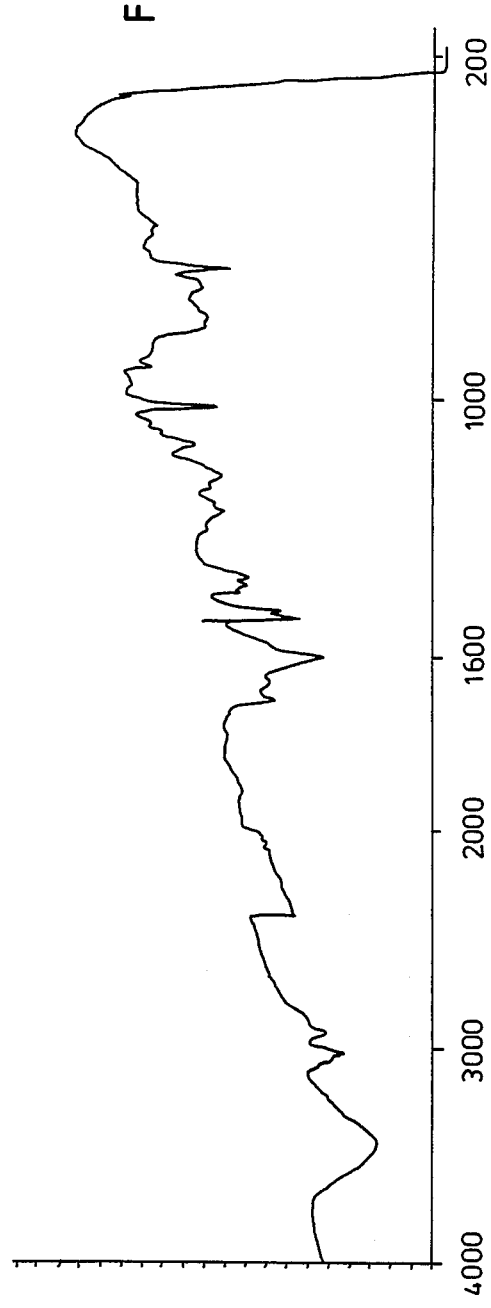
FIG. 2: IR-spectrum of the polymer dried at 1.3 Pa according to Example 8.
Figure 3:
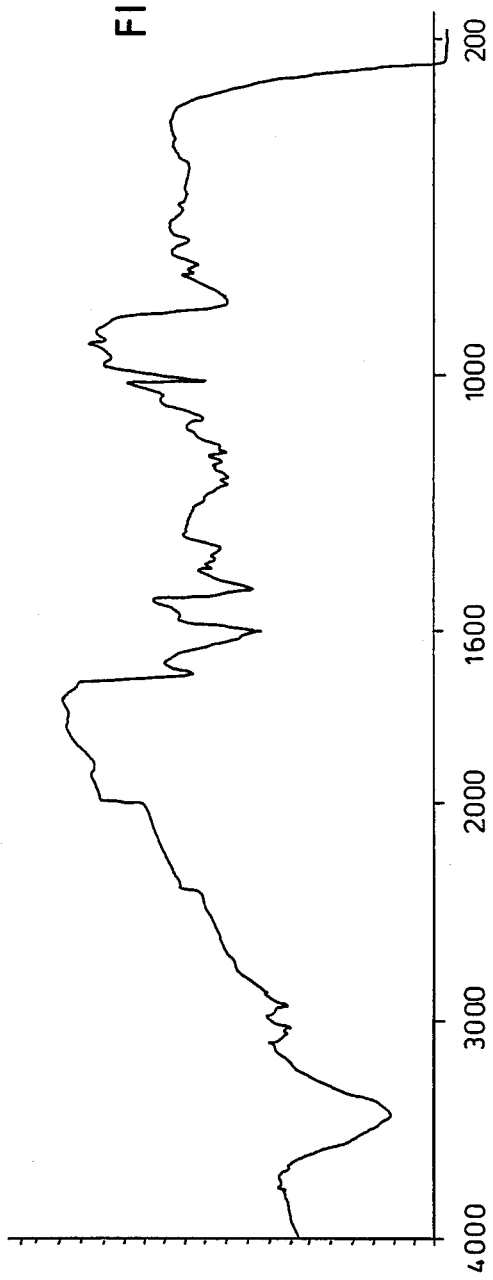
FIG. 3: IR-spectrum of the polymer dried at 1.3 Pa according to Example 11.

In FIGS. 1, 2 and 3, the wave numbers are plotted in cm$^{-1}$ from the right to the left.

Figure 4:
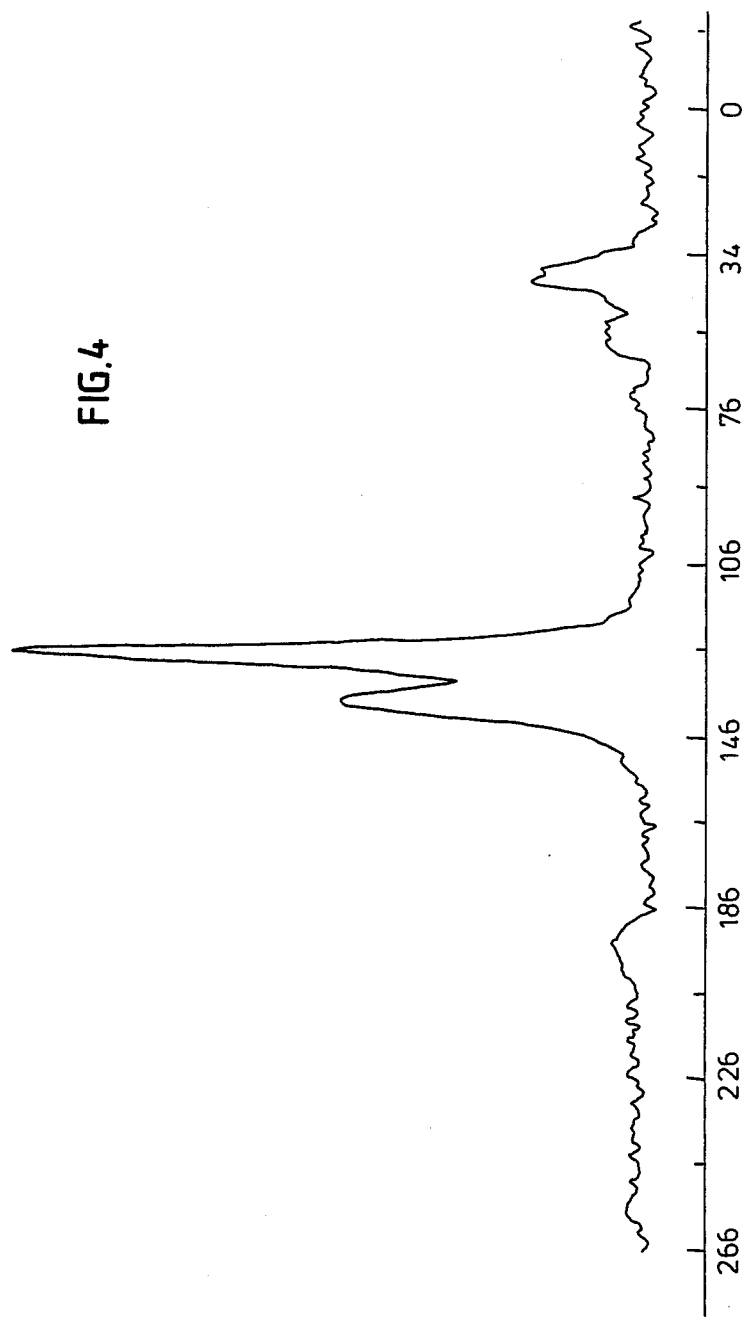
FIG. 4: $^{13}$C-solid state NMR-spectrum of the polymer according to Example 8.
Figure 5:
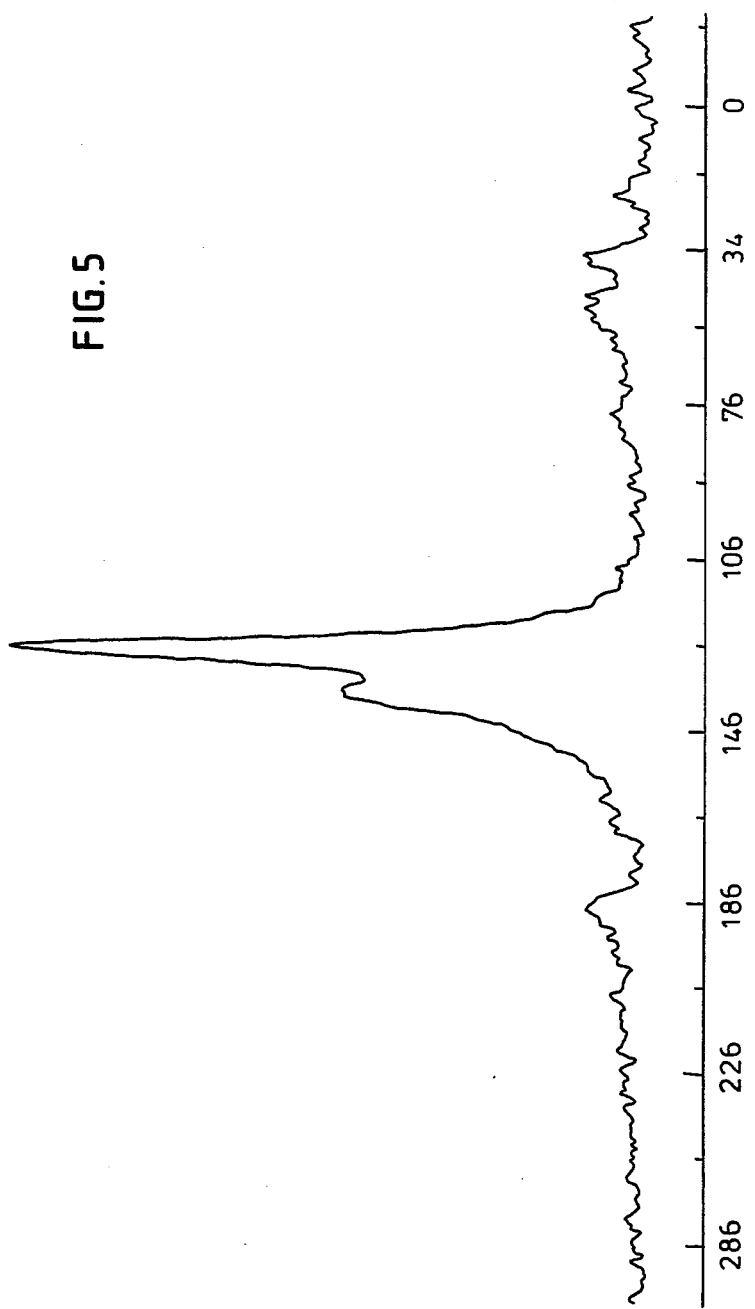
FIG. 5: $^{13}$C-solid state NMR-spectrum of the polymer according to Example 11.

In FIGS. 4 and 5, the chemical shifts in ppm relative to (CH$_3$)$_4$ Si (internal standard for NMR) are plotted from the right to the left.

While only several embodiments and examples of the present invention have been described, it is obvious that many changes and modifications may be made thereunto, without departing from the spirit and scope of the invention.

What is claimed is:

1. A polymer compound with conjugated double bonds, comprising heterocyclic and/or carbocyclic rings or ring systems in which said rings or ring systems are linked with one another in pairs via a carbon atom acting as a bridge member, said polymer compound having, at least, five of said rings or ring systems.

2. The polymer compound according to claim 1, further comprising a doping agent, said polymer compound containing up to and including 50%, by weight, of said doping agent.

3. The polymer compound according to claim 2, wherein said polymer compound contains from 0.01 to 30%, by weight, of said doping agent.

4. The polymer compound according to claim 1, wherein said polymer compound includes at least one unit of the formula:

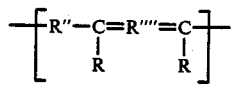

wherein,
R represents the same or different substituents selected from the group consisting of an alkyl radical having from 1 to 8 carbon atoms, phenyl and a hydrogen atom;
R" represents the same or different substituents selected from the group consisting of a monocyclic arylene radical, a monocyclic heteroarylene radical, a polycyclic arylene radical, a polycyclic heteroarylene radical, a monocyclic arylene radical substituted by at least one hydrocarbon radical having from 1 to 8 carbon atoms, a monocyclic heteroarylene radical substituted by at least one hydrocarbon radical having from 1 to 8 carbon atoms, a polycyclic arylene radical substituted by at least one hydrocarbon radical having from 1 to 8 carbon atoms and a polycyclic heteroarylene radical substituted by at least one hydrocarbon radical having from 1 to 8 carbon atoms; and
R'''' represents the same or different substituents selected from the group consisting of a monocyclic dihydroarenediylidene radical, a polycyclic dihydroarenediylidene radical, a monocyclic dihydroheteroarenediylidene radical, a polycyclic dihydroheteroarenediylidene radical, a monocyclic dihydroarenediylidene radical substituted by at least one hydrocarbon radical having from 1 to 8 carbon atoms, a monocyclic dihydroarenediylidene radical substituted by at least one hydrocarbon radical having from 1 to 8 carbon atoms, a polycyclic dihydroheteroarenediylidene radical substituted by at least one hydrocarbon radical having from 1 to 8 carbon atoms and a monocyclic dihydroarenediylidene radical substituted by at least one hydrocarbon radical having 1 to 8 carbon atoms.

5. The polymer compound according to claim 4, wherein R represents hydrogen atoms.

6. The polymer compound according to claim 4, wherein R" represents at least one substituent selected from the group consisting of phenylene, a five-ring heteroarylene radical, a five-ring heteroarylene radical substituted with at least one alkyl radical having from 1 to 8 carbon atoms, phenyl and benzyl.

7. The polymer compound according to claim 4, wherein at least part of the radicals R'''' are dihydrofurane-2,5-diylidene radicals.

8. The polymer compound according to claim 4, wherein said polymer compound includes, at least, one unit selected from the group consisting of

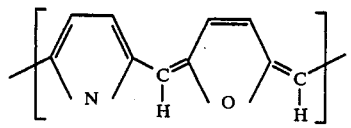

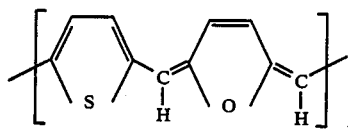

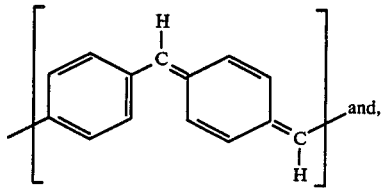

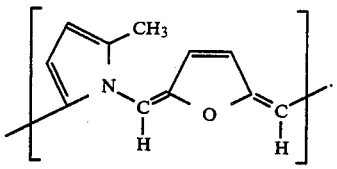

9. A process for producing a polymer compound with conjugated double bonds, including heterocyclic and/or carbocyclic rings or ring systems in which said rings or ring systems are linked with one another in pairs via a carbon atom acting as a bridge member, said polymer compound having, at least, five of said rings or ring members, comprising the step of:
reacting at least one compound of the formula

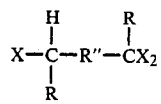 (I)

with at least one compound of the formula

H-R"-H (II)

wherein,
X represents a substituent selected from the group consisting of fluorine, chlorine, bromine, iodine, hydroxyl, a sulfate radical and a radical of the group consisting of —OR, —SO$_3$F, —SO$_3$R and —NR$_2$, in which X need not represent the same substituent when a plurality of compounds of formula I are reacted;
X$_2$ represents two radicals X., or an oxygen atom of a carbonyl group;
R represents the same or different substituents selected from the group consisting of an alkyl radical having from 1 to 8 carbon atoms, phenyl and a hydrogen atom; and
R" represents the same or different substituents selected from the group consisting of a monocyclic arylene radical, a monocyclic heteroarylene radical, a polycyclic arylene radical, a polycyclic heteroarylene radical, a monocyclic arylene radical substituted by at least one hydrocarbon radical having from 1 to 8 carbon atoms, a monocyclic heteroarylene radical substituted by at least one hydrocarbon radical having from 1 to 8 carbon atoms, a polycyclic arylene radical substituted by at least one hydrocarbon radical having from 1 to 8 carbon atoms and a polycyclic heteroarylene radical substituted by at least one hydrocarbon radical having from 1 to 8 carbon atoms.

10. The process according to claim 9, wherein said reacting step is carried out using a catalyst.

11. The process according to claim 9, wherein said reacting step is carried out in a solvent.

12. The process according to claim 9, wherein said reacting step is carried out at a temperature in the range of 0° to 250° C.

13. The process according to claim 9, wherein said reacting step is carried out at a process approximately 0.102 MPa (absolute).

14. The process according to claim 9, wherein said reacting step is carried out in a molar ratio of said compound of formula I to said compound of formula II of 0.9–1.1:1.

15. The process according to claim 14, wherein said molar ratio is 0.99–1.01:1.

16. The process according to claim 9, further comprising the step of:

doping said polymer compound by treating the same at a temperature of from 20° to 400° C. and a pressure of from $10^{-7}$ to 2000 Pa and subsequently admixing said polymer component with a doping agent.

17. The process according to claim 16, wherein said doping agent is at least one member selected from the group consisting of sodium, potassium, $H_2SO_4$, $HClO_4$, $H_2Cr_2O_7$, HI, $HNO_3$, $SbCl_5$, $AsCl_5$, $TiCl_4$, $FeCl_3$, $SnCl_4$, $ZnCl_2$, $AsF_5$ and iodine.

18. An electrically conducting or semiconductor compound made according to the process of claim 16.

19. An electrically conducting or semiconductor compound comprising the polymer compound of claim 2.

* * * * *